(12) United States Patent
Seo et al.

(10) Patent No.: US 10,897,019 B2
(45) Date of Patent: Jan. 19, 2021

(54) DISPLAY DEVICE

(71) Applicant: SAMSUNG DISPLAY CO., LTD., Yongin-si (KR)

(72) Inventors: Ilhun Seo, Yongin-si (KR); Yunmo Chung, Yongin-si (KR); Jaewook Kang, Yongin-si (KR); Daewoo Lee, Yongin-si (KR); Takyoung Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/456,519

(22) Filed: Jun. 28, 2019

(65) Prior Publication Data

US 2020/0091446 A1 Mar. 19, 2020

(30) Foreign Application Priority Data

Sep. 18, 2018 (KR) .......................... 10-2018-0111602

(51) Int. Cl.
*H01L 51/00* (2006.01)
*H01L 27/32* (2006.01)
*H01L 51/52* (2006.01)

(52) U.S. Cl.
CPC ...... *H01L 51/0097* (2013.01); *H01L 27/3276* (2013.01); *H01L 51/5253* (2013.01)

(58) Field of Classification Search
CPC ............. H01L 51/0097; H01L 51/5253; H01L 27/3276; H01L 51/52; H01L 51/5246
USPC ........................................................ 257/773
See application file for complete search history.

(56) References Cited

U.S. PATENT DOCUMENTS

| 10,121,977 | B2 | 11/2018 | Lee et al. | |
| 2015/0108433 | A1 | 4/2015 | Lee | |
| 2016/0111479 | A1* | 4/2016 | Kim | H01L 51/0097 |
| | | | | 257/40 |
| 2017/0365652 | A1 | 12/2017 | Li | |
| 2017/0371465 | A1* | 12/2017 | Ahn | G06F 3/044 |
| 2018/0053905 | A1* | 2/2018 | Lee | H01L 27/3272 |

FOREIGN PATENT DOCUMENTS

| KR | 10-2013-0026072 A | 3/2013 |
| KR | 10-2015-0046645 A | 4/2015 |
| KR | 10-2018-0021341 A | 3/2018 |

* cited by examiner

*Primary Examiner* — Caleen O Sullivan
(74) *Attorney, Agent, or Firm* — Kile Park Reed & Houtteman PLLC

(57) ABSTRACT

A display device includes a substrate including a first substrate portion including a first area, a second substrate portion including a second area, and a bending area between the first substrate portion and the second substrate portion, the substrate being bendable around a bending axis that extends in a first direction, an encapsulation portion over the first substrate portion, a seal portion between the first substrate portion and the encapsulation portion to bond the first substrate portion to the encapsulation portion, an intermediate wiring including a first intermediate wiring portion in the first area and a second intermediate wiring portion in the second area, the intermediate wiring being covered by at least one inorganic layer, and a connection wiring including at least a portion in the bending area and connecting the first intermediate wiring portion to the second intermediate wiring portion.

20 Claims, 4 Drawing Sheets

DISPLAY DEVICE

CROSS-REFERENCE TO RELATED APPLICATION

Korean Patent Application No. 10-2018-0111602, filed on Sep. 18, 2018, in the Korean Intellectual Property Office, and entitled: "Display Device," is incorporated by reference herein in its entirety.

BACKGROUND

1. Field

One or more embodiments relate to a display device.

2. Description of the Related Art

Generally, display devices may be used in electronic apparatuses such as smartphones, laptop computers, digital cameras, camcorders, personal digital assistants, notebook computers, table personal computers, or electronic apparatuses such as desktop computers, televisions, outdoor billboards, display devices for exhibition, instrument panels for automobiles, head up displays (HUDs).

SUMMARY

Embodiments are directed to a display device including a substrate including a first substrate portion including a first area, a second substrate portion including a second area, and a bending area between the first substrate portion and the second substrate portion, the substrate being bendable around a bending axis that extends in a first direction at the bending area, an encapsulation portion over the first substrate portion, a seal portion between the first substrate portion and the encapsulation portion to bond the first substrate portion to the encapsulation portion, an intermediate wiring including a first intermediate wiring portion in the first area and a second intermediate wiring portion in the second area, the intermediate wiring being covered by at least one inorganic layer, and a connection wiring including at least a portion in the bending area and connecting the first intermediate wiring portion to the second intermediate wiring portion.

The second substrate portion may be separately located below the first substrate portion in a vertical direction of the substrate. The first substrate portion may be connected to the second substrate portion by the bending area.

The bending area may be in an interval between the first substrate portion and the second substrate portion. A bending material may fill the interval.

The bending material may include an organic material.

A height of the bending material may correspond to a sum of a first thickness of the at least one inorganic layer and a second thickness of the intermediate wiring in the vertical direction of the substrate.

A support material may support the substrate. The support material may be in a portion of the interval between the first substrate portion and the second substrate portion below the bending material.

The connection wiring may extend across the first area, the bending area, and the second area. The connection wiring may be bendable in the bending area.

The connection wiring may be connected to the first intermediate wiring portion and the second intermediate wiring portion by respective contact portions inside contact holes in the at least one inorganic layer.

The connection wiring may be exposed over the substrate. An upper organic layer covering the connection wiring may be on the connection wiring.

The connection wiring may be surrounded by the bending material and the upper organic layer in the bending area.

The seal portion may be spaced apart from the upper organic layer. A space may be between the seal portion and the upper organic layer.

The seal portion may at least partially overlap the first intermediate wiring portion in a vertical direction of the substrate.

A pad terminal electrically connected to the connection wiring may be in the second substrate portion. A driving terminal of a driver may be connected to the pad terminal.

A display area may be in the first area. The intermediate wiring may be electrically connected to a device inside the display area.

Embodiments are directed to a display device including a substrate including a first substrate portion including a display area, a second substrate portion including a pad terminal, and a bending area connecting the first substrate portion to the second substrate portion, an encapsulation portion over the first substrate portion, a seal portion between the first substrate portion and the encapsulation portion to bond the first substrate portion to the encapsulation portion, an intermediate wiring including a first intermediate wiring portion electrically connected to a device inside the display area, and a second intermediate wiring portion electrically connected to the pad terminal and covered by at least one inorganic layer, and a connection wiring over the substrate, the connection wiring connecting the first intermediate wiring portion to the second intermediate wiring portion. The bending area may be in an interval between the first substrate portion and the second substrate portion. The bending area may be filled with a bending material including an organic material.

A height of the bending material may correspond to a sum of a first thickness of the at least one inorganic layer and a second thickness of the intermediate wiring in a vertical direction of the substrate.

A support material that supports the substrate may be in a portion of the interval between the first substrate portion and the second substrate portion below the bending material.

The connection wiring may extend across the first substrate portion, the bending area, and the second substrate portion. The connection wiring may be bendable in the bending area.

The connection wiring may be connected to the first intermediate wiring portion and to the second intermediate wiring portion respectively by contact portions inside contact holes arranged in the at least one inorganic layer.

The connection wiring may be exposed over the substrate. An upper organic layer covering the connection wiring may be on the connection wiring. The connection wiring may be surrounded by the bending material and the upper organic layer in the bending area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
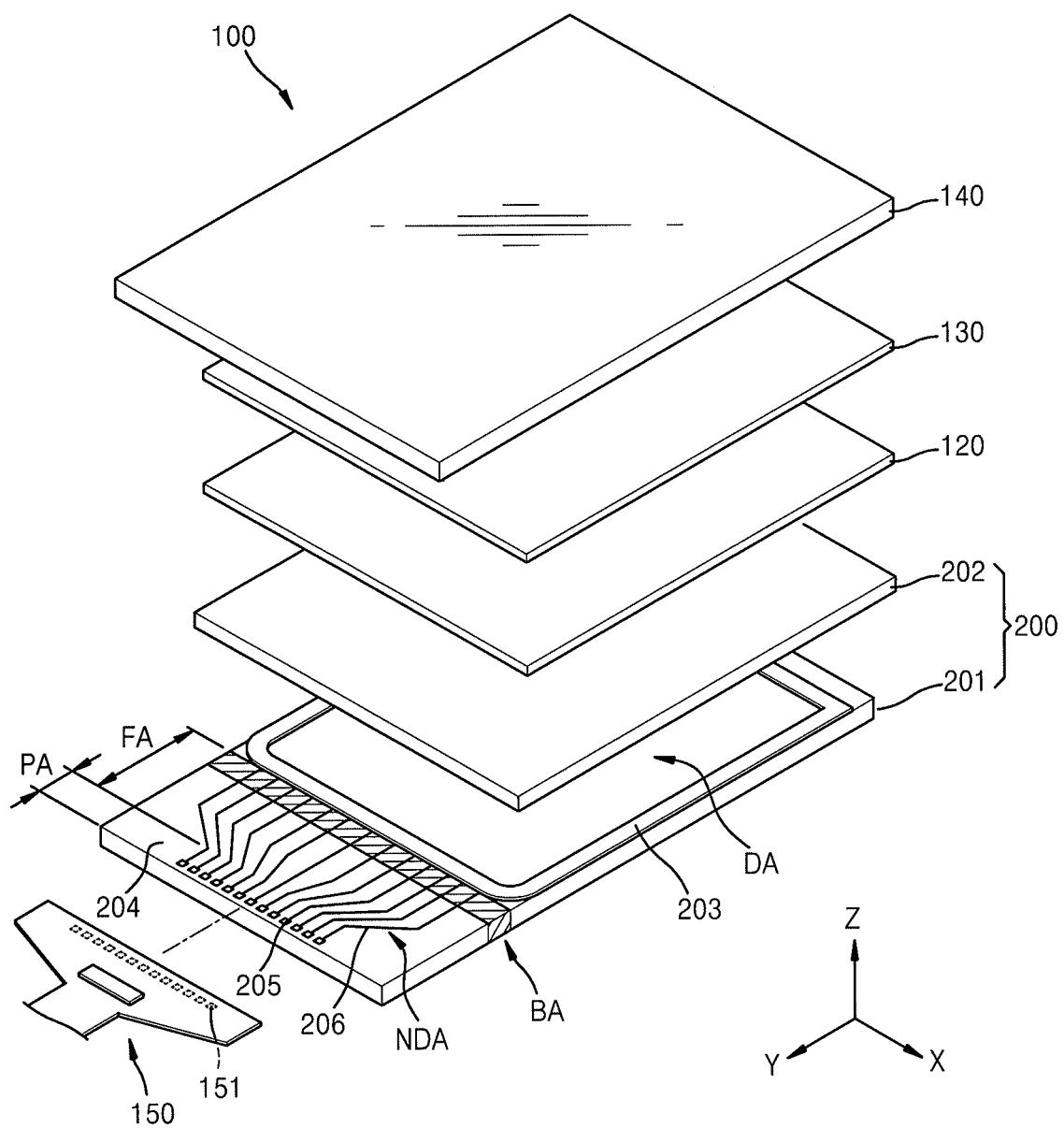
FIG. 1 illustrates a separated perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 illustrates a separated perspective view of a display device 100 according to an embodiment.

Referring to FIG. 1, the display device 100 may include a display panel 200. In an embodiment, the display device 100 may be an organic light-emitting display device. In some implementations, the display device 100 may be a liquid crystal display, a field emission display, or an electronic paper display device.

The display panel 200 may include a substrate 201 and an encapsulation portion 202 arranged over the substrate 201. A seal portion 203 may be arranged between the substrate 201 and the encapsulation portion 202. The seal portion 203 may be arranged on a surface faced by the substrate 201 and the encapsulation portion 202. The seal portion 203 may be arranged along an edge of the substrate 201 and the encapsulation portion 202.

One of the substrate 201 and the encapsulation portion 202 may be exposed by extending to the outside of the other. For example, one area 204 of the substrate 201 may be exposed to the outside of an area where the substrate 201 overlaps the encapsulation portion 202 in a second direction (Y-direction) of the display panel 200. The exposed area 204 includes a non-display area NDA. In an embodiment, the one area 204 of the substrate 201 may not be exposed and one area of the encapsulation portion 202 may be exposed.

A pad area PA, in which a plurality of pad terminals 205 are patterned, and a fan-out area FA, in which a plurality of wirings 206 are patterned may be arranged in the non-display area NDA.

The pad terminal 205 may be electrically connected to the wiring 206 and may be also electrically connected to a driving terminal 151 of a driver 150 such as a chip-on-film (COF). The wiring 206 may be electrically connected to devices inside a display area DA that displays an image.

A touch sensing unit 120 may be arranged over the encapsulation portion 202. The touch sensing unit 120 may be an on-cell touch sensing unit arranged on the encapsulation portion 202. The on-cell touch sensing unit may include a touch screen pattern. The touch sensing unit 120 may be, for example, formed as one body with the encapsulation portion 202.

A polarization layer 130 may be arranged over the touch sensing unit 120. The polarization layer 130 may block external light reflection.

A window cover 140 configured to protect the display panel 200, the touch sensing unit 120, and the polarization layer 130 may be arranged over the polarization layer 130. The window cover 140 may include rigid glass or a flexible film.

In an embodiment, a bending area BA that bends the substrate 201 in one direction may be arranged in the display panel 200.

Figure 2:
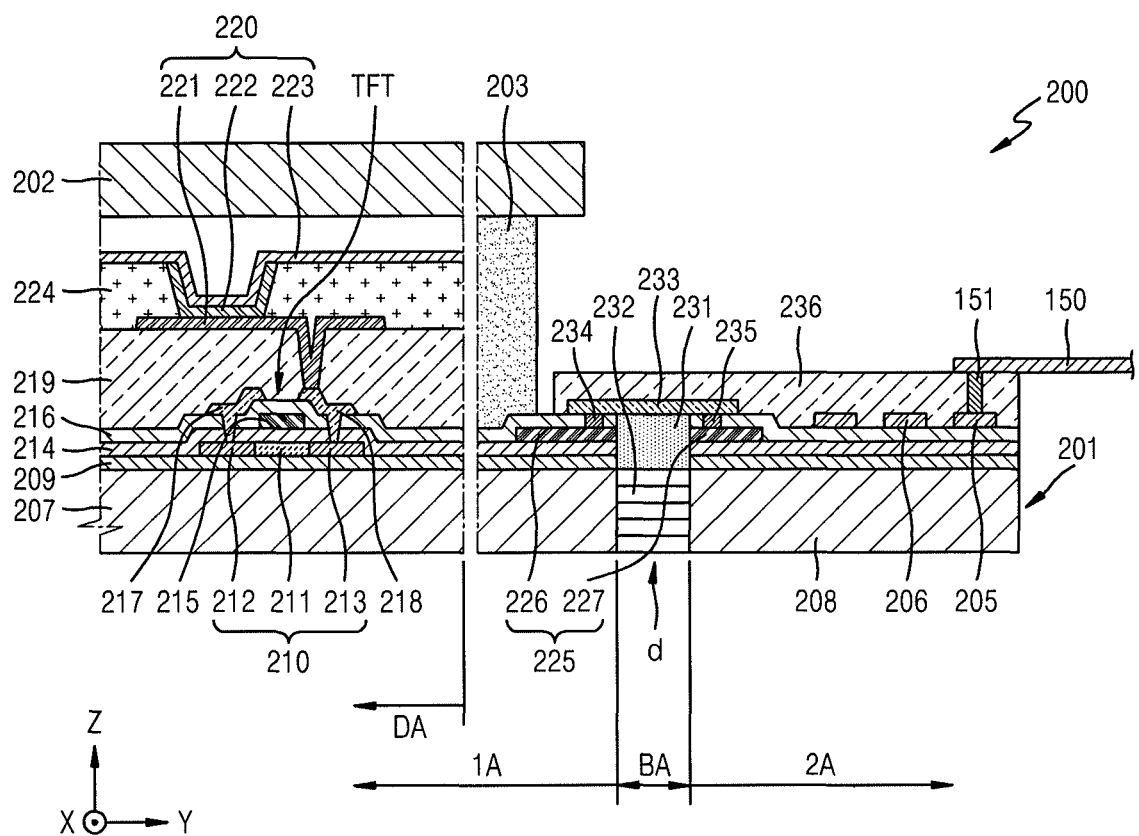
FIG. 2 illustrates an enlarged cross-sectional view of the display device of FIG. 1.
Figure 3:
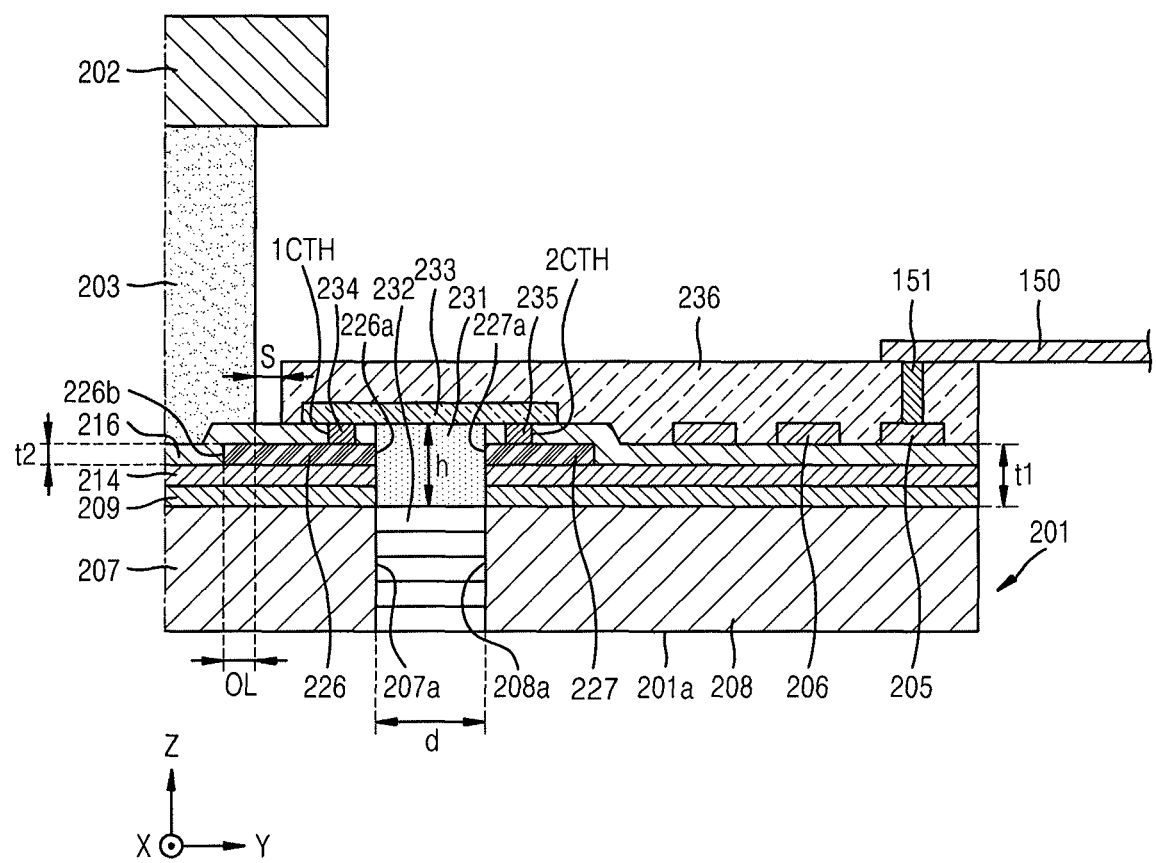
FIG. 3 illustrates an enlarged cross-sectional view of a state in which a portion of the display device of FIG. 2 is unfolded.
Figure 4:
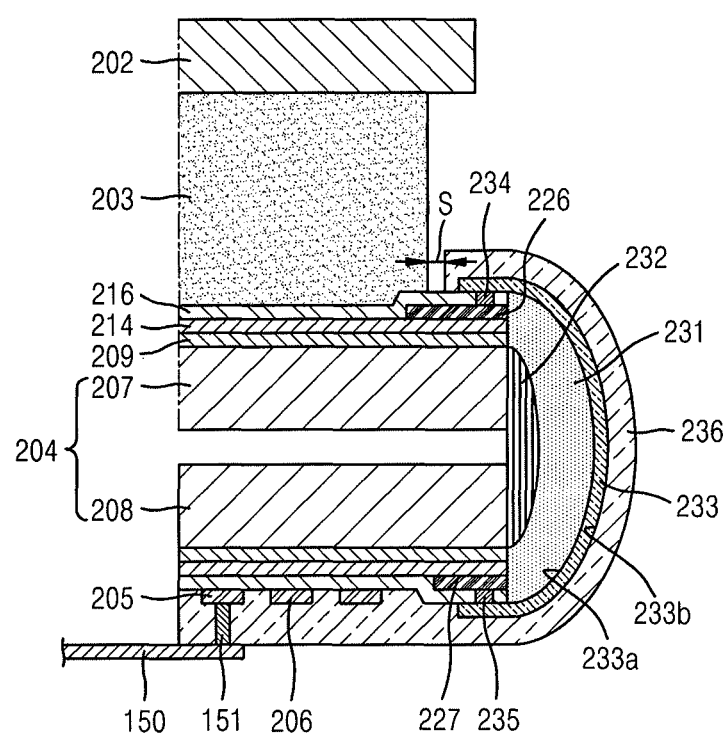
FIG. 4 illustrates an enlarged cross-sectional view of a state in which a portion of the display device of FIG. 3 is bent.

FIG. 2 illustrates an enlarged cross-sectional view of a portion of the display device 100 of FIG. 1. FIG. 3 illustrates an enlarged cross-sectional view of a state in which a portion of the display device 100 of FIG. 2 is unfolded. FIG. 4 is an enlarged cross-sectional view of a state in which a portion of the display device 100 of FIG. 3 is bent.

Referring to FIGS. 2 to 4, the display panel 200 may include the substrate 201. The substrate 201 may include a first substrate portion 207 in which a first area 1A is arranged, a second substrate portion 208 in which a second area 2A is arranged, and the bending area BA between the first area 207 and the second area 208. The bending area BA may extend in a first direction (X-direction) of the substrate 201. The bending area BA may be located between the first area 1A and the second area 2A in the second direction (Y-direction) that crosses the first direction (X-direction). The substrate 201 may be bent around a virtual bending axis extending in the first direction (X-direction).

The substrate 201 including the first substrate portion 207 and the second substrate portion 208 may include a rigid substrate. The first substrate portion 207 and the second substrate portion 208 may be substrates including the same material. In an embodiment, the first substrate portion 207 and the second substrate portion 208 may be glass substrates. In some implementations, the first substrate portion 207 and the second substrate portion 208 may be a polymer substrate, a metal substrate, or a composite substrate thereof.

The first area 1A includes the display area DA. In an embodiment, the first area 1A may further include a portion of the non-display area NDA in addition to the display area DA.

A thin film transistor TFT may be arranged in the display area DA and may be electrically connected to an organic light-emitting diode 220, which is a display element. Electric connection of the organic light-emitting diode 220 to the thin film transistor TFT may include electrical connection of a pixel electrode 221 of the organic light-emitting diode 220 to the thin film transistor TFT.

A thin film transistor TFT may be further arranged in a peripheral area outside the display area DA. The thin film transistor TFT arranged in the peripheral area may be a portion of a circuit unit configured to control an electric signal applied to the display area DA.

The thin film transistor TFT may include a semiconductor layer 210, a gate electrode 215, a source electrode 217, and a drain electrode 218. The semiconductor layer 210 may include amorphous silicon, polycrystalline silicon, or an organic semiconductor material.

A first inorganic layer 209 may be arranged on the substrate 201. The first inorganic layer 209 may be a barrier layer. The first inorganic layer 209 may include an inorganic material such as silicon oxide, silicon nitride, and/or silicon oxynitride. The first inorganic layer 209 may planarize a surface of the substrate 201 and reduce or prevent the penetration of moisture or external air. The first inorganic layer 209 may be in a form of a single layer or a multi-layer.

The semiconductor layer 210 may be arranged on the first inorganic layer 209. The semiconductor layer 210 may include a channel region 211, a source region 212, and a drain region 213. The source region 212 and the drain region 213 may be arranged on two opposite sides of the channel region 211 and may be doped with impurities.

The semiconductor layer 210 may be covered by a second inorganic layer 214. The second inorganic layer 214 may include a gate insulating layer. The second inorganic layer 214 may include an inorganic material such as silicon oxide, silicon nitride, and/or silicon oxynitride. The second inorganic layer 214 may be in a form of a single layer or a multi-layer.

The gate electrode 215 may be arranged on the second inorganic layer 214. The gate electrode 215 may include a metal material having conductivity. For example, the gate electrode 215 may include one of Mo, Al, Cu, and Ti. The gate electrode 215 may be in a form of a single layer or a multi-layer.

The gate electrode 215 may be covered by a third inorganic layer 216. The third inorganic layer 216 may be an interlayer insulating layer. The third inorganic layer 216 may include an inorganic material such as silicon oxide, silicon nitride, and/or silicon oxynitride. The third inorganic layer 216 may be in a form of a single layer or a multi-layer.

The source electrode 217 and the drain electrode 218 may be arranged on the third inorganic layer 216. The source electrode 217 and the drain electrode 218 may include a metal material having conductivity. For example, the source electrode 217 and the drain electrode 218 may include one of Mo, Al, Cu, and Ti. The source electrode 217 and the drain electrode 218 may be in a form of a single layer or a multi-layer. For example, each of the source electrode 217 and the drain electrode 218 may have a stacked structure of Ti/Al/Ti.

The first inorganic layer 209, the second inorganic layer 214, and the third inorganic layer 216 may be deposited by a deposition process. The first inorganic layer 209, the second inorganic layer 214, and the third inorganic layer 216 may extend over the first substrate portion 207 and the second substrate portion 208.

A planarization layer 219 may be arranged on the thin film transistor TFT. For example, in the case where the organic light-emitting diode 220 is arranged over the thin film transistor TFT, the planarization layer 219 may planarize a portion located on the thin film transistor TFT. The planarization layer 219 may include an organic material. For example, the planarization layer 219 may include acrylic, benzocyclobutene (BCB), or hexamethyldisiloxane (HMDSO).

A pixel-defining layer 224 may be arranged on the planarization layer 219. The pixel-defining layer 224 may include an opening corresponding to each sub-pixel and may define each sub-pixel by the opening. For example, the pixel-defining layer 224 may include an opening that exposes a portion of a surface of the pixel electrode 221. The pixel-defining layer 224 may include an organic material such as polyimide or HMDSO.

The planarization layer 219 and the pixel-defining layer 224 may have a single-layer stacking structure of an organic material layer. In some implementations, the planarization layer 219 may have a two-layer structure or another organic material layer may be further arranged between the planarization layer 219 and the pixel-defining layer 224.

The organic light-emitting diode 220 may be arranged on the planarization layer 219. The organic light-emitting diode 220 may include the pixel electrode 221, an opposite electrode 223, and an intermediate layer 222 arranged between the pixel electrode 221 and the opposite electrode 223. The intermediate layer 222 may include an emissive layer.

The pixel electrode 221 may contact one of the source electrode 217 and the drain electrode 218 through a contact hole provided in the planarization layer 219. The pixel electrode 221 may include a transparent electrode or a reflective electrode. In the case where the pixel electrode 221 includes a transparent electrode, the pixel electrode 221 includes a transparent conductive layer. In the case where the pixel electrode 221 includes a reflective electrode, the pixel electrode 221 includes a reflective layer and a transparent conductive layer on the reflective layer.

The intermediate layer 222 may include an organic emissive layer.

In another embodiment, the intermediate layer 222 may include an organic emissive layer and may further include at least one of a hole injection layer (HIL), a hole transport layer (HTL), an electron transport layer (ETL), and an electron injection layer (EIL).

In an embodiment, the intermediate layer 222 may include an organic emissive layer and may additionally further include various functional layers depending on a use purpose of the display device 100.

The intermediate layer 222 may have a suitable structure. For example, the intermediate layer 222 may include a layer that is one body over a plurality of pixel electrodes 221 or may include a layer patterned to correspond to each of the plurality of pixel electrodes 221.

The opposite electrode 223 may cover the display area DA. The opposite electrode 223 may extend as one body over a plurality of organic light-emitting diodes 220 and correspond to the plurality of pixel electrodes 221. The opposite electrode 223 may be a common electrode. The opposite electrode 223 may be a transparent electrode or a reflective electrode. When the opposite electrode 223 is a transparent electrode, the opposite electrode 223 may include a metal layer and a transparent conductive layer arranged on the metal layer. When the opposite electrode 223 is a reflective electrode, the opposite electrode 223 may include a metal layer.

In an embodiment, a plurality of sub-pixels may be arranged over the first substrate portion 207. Each sub-pixel may implement red, green, blue or white color, as examples.

The second area 2A includes the non-display area NDA. In an embodiment, the second area 2A may further include the display area DA.

The plurality of inorganic layers, for example, the first inorganic layer 209, the second inorganic layer 214, and the third inorganic layer 216, may be stacked on the second substrate portion 208. Like the first substrate portion 207, the first inorganic layer 209, the second inorganic layer 214, and the third inorganic layer 216 may be stacked on the second substrate portion 208.

In some implementations, another inorganic layer may be further arranged over the second substrate portion 208, or some inorganic layers may be omitted. For example, besides the first inorganic layer 209, the second inorganic layer 214, and the third inorganic layer 216, another inorganic layer may be independently arranged over the second substrate portion 208.

The encapsulation portion 202 may be coupled over the substrate 201. The encapsulation portion 202 may protect the organic light-emitting diode 202 and other devices from moisture or external air. In an embodiment, the encapsulation portion 202 may be a rigid glass substrate. In an embodiment, the encapsulation portion 202 may include a polymer substrate, a metal substrate, or a composite substrate thereof.

The seal portion 203 may be arranged between the substrate 201 and the encapsulation portion 202. The seal portion 203 may be arranged on surfaces of the first substrate portion 207 and the encapsulation portion 202 that face each other. The seal portion 203 may surround the display area DA over the first substrate portion 207. The seal portion 203 may include frit glass. The frit glass may include glass powder and an oxide powder. The seal portion 203 may bond the first substrate portion 207 onto the encapsulation portion 202.

The first substrate portion 207 may be spaced apart from the second substrate portion 208 so as to reduce a dead space, which is an area that is not directly involved in emitting light, for example, an area other than the display area DA. The first substrate portion 207 and the second substrate portion 208 that are spaced apart from each other may be connected by the bending area BA. The first substrate portion 207 and the second substrate portion 208 may be located vertically with respect to each other.

An intermediate wiring 225 may be arranged over the substrate 201. The intermediate wiring 225 may be electrically connected to a device inside the display area DA. The intermediate wiring 225 may include a first intermediate wiring portion 226 and a second intermediate wiring portion 227. In some implementations, the intermediate wiring 225 may include a plurality of spaced apart intermediate wiring portions.

The first intermediate wiring portion 226 may be arranged in the first area 1A. A first end 226a of the first intermediate wiring portion 226 may extend to one edge 207a of the first substrate portion 207. A second end 226b of the first intermediate wiring portion 226 may overlap the seal portion 203 in the vertical direction (Z-direction) of the substrate 201.

The second intermediate wiring portion 227 may be arranged in the second area 2A. An end 227a of the second intermediate wiring portion 227 may extend to one edge 208a of the second substrate portion 208. The one edge 207a of the first substrate portion 207 may face the one edge 208a of the second substrate portion 208.

The first intermediate wiring portion 226 and the second intermediate wiring portion 227 may be arranged on the same layer as the gate electrode 215. The first intermediate wiring portion 226 and the second intermediate wiring portion 227 may be formed by using the same material as the gate electrode 215 during a same process of forming the gate electrode 215. The first intermediate wiring portion 226 and the second intermediate wiring portion 227 may be covered by the third inorganic layer 216.

In an embodiment, the first intermediate wiring portion 226 and the second intermediate wiring portion 227 may be covered by an inorganic layer that is independently arranged over the second substrate portion 208. In some implementations, a plurality of inorganic layers may be stacked on the first intermediate wiring portion 226 and the second intermediate wiring portion 227.

The connection wiring 233 may be arranged over the intermediate wiring 225. The connection wiring 233 may connect the first intermediate wiring portion 226 to the second intermediate wiring portion 227. At least a portion of the connection wiring 233 may be arranged in the bending area BA.

The connection wiring 233 may extend across the first area 1A, the bending area BA and the second area 2A. The connection wiring 233 may be bent in the bending area BA. The connection wiring 233 may include the same material as the source electrode 217 and the drain electrode 218 during a same process of forming the source electrode 217 and the drain electrode 218. The connection wiring 233 may include one of Mo, Al, Cu, and Ti. In an embodiment, the connection wiring 233 may have a stacked structure of Ti/Al/Ti. The connection wiring 233 may be electrically connected to the wiring 206 arranged in the fan-out area FA and the pad terminal 205 arranged in the pad area PA. The pad terminal 205 may be connected to the driving terminal 151 of the driver 150.

The connection wiring 233 may be electrically connected to the first intermediate wiring portion 226 by a first contact portion 234 filling a first contact hole 1CTH that passes through the third inorganic layer 216. The connection wiring 233 may be electrically connected to the second intermediate wiring portion 227 by a second contact portion 235 filling a second contact hole 2CTH that passes through the third inorganic layer 216.

As described above, the first intermediate wiring portion 226 arranged over the first substrate portion 207 may be electrically connected to the second intermediate wiring portion 227 arranged over the second substrate portion 208 by the connection wiring 233.

As described above, the first substrate portion 207 may be spaced apart from the second substrate portion 208. The second substrate portion 208 may be arranged below the first substrate portion 207 in the vertical direction of the substrate 201. The first substrate portion 207 may be connected to the second substrate portion 208 by the bending area BA. The bending area BA may be arranged in an interval d between the first substrate portion 207 and the second substrate portion 208. The interval d may correspond to a space between the one edge 207a of the first substrate portion 207 and the one edge 208a of the second substrate portion 208. The interval d may extend in the first direction (X-direction of the substrate 201).

A bending material 231 may be arranged in the interval d. The bending material 231 may include an organic material. For example, the bending material 231 may include one of acrylic, BCB, HMDSO, and polyimide.

With regard to the bending material 231, an organic material prepared separately from the planarization layer 219 in the first area 1A may be arranged in the interval d. In an embodiment, the bending material 231 may be formed using the same material as that of the planarization layer 219 during the same process of forming the planarization layer 219. When the bending material 231 is an organic material that can be arranged in the interval d between the first substrate portion 207 and the second substrate portion 208, the organic material may be simultaneously formed with one of the organic materials provided to the display panel 200, or may be formed through a separate process.

A height h of the bending material 231 may correspond to a sum of a first thickness t1 of the plurality of inorganic layers including the first inorganic layer 209, the second inorganic layer 214, and the third inorganic layer 216 arranged on the substrate 201, and a second thickness t2 of the intermediate wiring 225. The first thickness t1 of the plurality of inorganic layers, for example, the first inorganic layer 209, the second inorganic layer 214, and the third inorganic layer 216, may be a total thickness of the first inorganic layer 209, the second inorganic layer 214, and the third inorganic layer 216 that are stacked. The second thickness t2 of the intermediate wiring 225 may be a thickness of one of the first intermediate wiring portion 226 and the second intermediate wiring portion 227.

A support material 232 configured to support the substrate 201 may be further arranged in a portion of the interval d between the first substrate portion 207 and the second substrate portion 208 under the bending material 231. The support material 232 may be a material that has flexibility to support the substrate 201 as the substrate 201 is bent.

The connection wiring 233 may be exposed on the first substrate portion 207 and the second substrate portion 208. To prevent oxidation of the connection wiring 233, an upper organic layer 236 may be arranged on the connection wiring 233.

The upper organic layer 236 may be made of a suitable material. For example, the upper organic layer 236 may be formed by using the same material as that of the planarization layer 219 during the same process as a process of foiling the planarization layer 219. When the upper organic layer 236 is an organic material covering the connection wiring 233, the upper organic layer 236 may be simultaneously formed with one of the organic materials provided to the display panel 200, or may be formed through a separate process.

In the bending area BA, the connection wiring 233 may be surrounded by the bending material 231 and the upper organic layer 236. For example, a first surface 233a of the connection wiring 233 may be covered by the bending material 231, and a second surface 233b of the connection wiring 233 may be covered by the upper organic layer 236. The first surface 233a and the second surface 233b of the connection wiring 233 may be two opposite surfaces.

The seal portion 203 may be spaced apart from the upper organic layer 236. For example, a space S may be formed between the seal portion 203 and the upper organic layer 236. Due to the space S, the upper organic layer 236 may be spaced apart from the seal portion 203. The space S may be formed so as to help prevent damage to the upper organic layer 236 including the organic material, which may be relatively vulnerable to heat while laser energy is irradiated onto the seal portion 203 for bonding of the first substrate portion 207 and the encapsulation portion 202.

The seal portion 203 and the first intermediate wiring portion 226 may include an overlapping area OL in which the seal portion 203 at least partially overlaps the first intermediate wiring portion 226 in the vertical direction (Z-direction) of the substrate 201. The overlapping area OL may be formed so as to help prevent damage to the first substrate portion 207 during a laser irradiation process. The first intermediate wiring portion 226 may block a laser beam from being irradiated onto the first substrate portion 207.

A process of manufacturing the display panel 200 having the above configuration is briefly described below.

The substrate 201 may be prepared. The substrate 201 may have a structure in which the first substrate portion 207, the second substrate portion 208, and the bending area BA are connected as one body. The substrate 201 at an initial stage may be a single glass substrate in which the first substrate portion 207 is not separated from the second substrate portion 208. The same glass material as that of the first substrate portion 207 and the second substrate portion 208 may be arranged in the bending area BA so as to connect the first substrate portion 207 to the second substrate portion 208. In an embodiment, the first substrate portion 207, the second substrate portion 208, and the bending area BA may constitute one body.

The first inorganic layer 209, the second inorganic layer 214, and the third inorganic layer 216 are formed on the first substrate portion 207, the second substrate portion 208, and the bending area BA. The first intermediate wiring portion 226 may be patterned over the first substrate portion 207, and the second intermediate wiring portion 227 may be patterned over the second substrate portion 208. The first intermediate wiring portion 226 and the second intermediate wiring portion 227 may be formed on the second inorganic layer 214.

Through an etching process, the first contact hole 1CTH may be formed in the first area 1A, and the second contact hole 1CTH may be formed in the second area 2A. The first contact hole 1CTH and the second contact hole 2CTH may be formed by removing a portion of the third inorganic layer 216.

The connection wiring 233 may be formed over the intermediate wiring 225. The connection wiring 233 may extend across the first area 1A, the bending area BA, and the second area 2A. The connection wiring 233 may be electrically connected to the first intermediate wiring portion 226 by the first contact portion 234 filling the first contact hole 1CTH. The connection wiring 233 may be electrically connected to the second intermediate wiring portion 227 by the second contact portion 235 filling the second contact hole 2CTH.

While the first contact hole 1CTH and the second contact hole 2CTH are formed, the interval d may be formed in the bending area BA by the same etching process. The interval d may include an area that passes through the first inorganic layer 209, the second inorganic layer 214, and the third inorganic layer 216.

The bending material 231 including the organic material may fill the interval d.

The support material 232 may be provided under the bending material 231. For example, an area under the bending material 231 may be etched from a bottom surface 201a of the substrate 201 by a predetermined depth in the vertical direction (Z-direction) of the substrate 201. The support material 232 may fill the etched area.

Through the above process, the first substrate portion 207 may be separated from the second substrate portion 208. The bending material 231 and the support material 232 may fill the interval d between the first substrate portion 207 and the second substrate portion 208. When the bending area BA is bent in one direction, as shown in FIG. 4, the second substrate portion 208 may be located below the first substrate portion 207 in the vertical direction (Z-direction) of the substrate 201.

By way of summation and review, a display unit may be arranged over a substrate of a display device. A wiring may be arranged in one area of the substrate, and a driver may be connected to a pad terminal. In addition to an area in which a display unit configured to display an image is arranged, the display device may also include a dead space, which is an area that is not directly involved in emitting light. The dead space may include an area in which a wiring such as a fan-out unit is arranged and an area in which a driver such as a chip-on-film (COF) is connected to the pad terminal.

To implement a full screen display, it is desirable that a display device reduce an area of a dead space. One or more embodiments include a display device that minimizes a dead space. For example, in the display device according to an embodiments, a plurality of substrate portions may be bent and relocated vertically. As a result, a dead space may be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof the present invention as set forth in the following claims.

What is claimed is:

1. A display device, comprising:
a substrate including a first substrate portion including a first area, a second substrate portion including a second area, and a bending area between the first substrate portion and the second substrate portion, the substrate being bendable around a bending axis that extends in a first direction at the bending area;
an encapsulation portion over the first substrate portion;
a seal portion between the first substrate portion and the encapsulation portion to bond the first substrate portion to the encapsulation portion;
an intermediate wiring including a first intermediate wiring portion in the first area and a second intermediate wiring portion in the second area, the intermediate wiring being covered by at least one inorganic layer; and
a connection wiring including at least a portion in the bending area and connecting the first intermediate wiring portion to the second intermediate wiring portion, wherein
the second substrate portion is separated from the first substrate portion with the bending area being in an interval between the first substrate portion and the second substrate portion, and
a bending material fills the interval.

2. The display device as claimed in claim 1, wherein the bending material includes an organic material.

3. The display device as claimed in claim 1, wherein a height of the bending material corresponds to a sum of a first thickness of the at least one inorganic layer and a second thickness of the intermediate wiring in the vertical direction of the substrate.

4. The display device as claimed in claim 3, wherein a support material supports the substrate and is in a portion of the interval between the first substrate portion and the second substrate portion below the bending material.

5. The display device as claimed in claim 1, wherein the connection wiring extends across the first area, the bending area, and the second area, and is bendable in the bending area.

6. The display device as claimed in claim 5, wherein the connection wiring is connected to the first intermediate wiring portion and the second intermediate wiring portion by respective contact portions inside contact holes in the at least one inorganic layer.

7. The display device as claimed in claim 1, wherein:
the connection wiring is exposed over the substrate, and
an upper organic layer covering the connection wiring is on the connection wiring.

8. The display device as claimed in claim 7, wherein the connection wiring is surrounded by the bending material and the upper organic layer in the bending area.

9. The display device as claimed in claim 7, wherein:
the seal portion is spaced apart from the upper organic layer, and
a space is between the seal portion and the upper organic layer.

10. The display device as claimed in claim 1, wherein the seal portion at least partially overlaps the first intermediate wiring portion in a vertical direction of the substrate.

11. The display device as claimed in claim 1, wherein:
a pad terminal electrically connected to the connection wiring is in the second substrate portion, and
a driving terminal of a driver is connected to the pad terminal.

12. The display device as claimed in claim 1, wherein:
a display area is in the first area, and
the intermediate wiring is electrically connected to a device inside the display area.

13. The display device as claimed in claim 1, further comprising an insulation layer on the intermediate wiring, wherein the connection wiring is disposed on the insulation layer.

14. A display device, comprising:
a substrate including a first substrate portion including a first area, a second substrate portion including a second area, and a bending area between the first substrate portion and the second substrate portion, the substrate being bendable around a bending axis that extends in a first direction at the bending area;
an encapsulation portion over the first substrate portion;
a seal portion between the first substrate portion and the encapsulation portion to bond the first substrate portion to the encapsulation portion;
an intermediate wiring including a first intermediate wiring portion in the first area and a second intermediate wiring portion in the second area, the intermediate wiring being covered by at least one inorganic layer; and
a connection wiring including at least a portion in the bending area and connecting the first intermediate wiring portion to the second intermediate wiring portion, wherein
the second substrate portion is separately located below the first substrate portion in a vertical direction of the substrate, and
the first substrate portion is connected to the second substrate portion by the bending area.

15. A display device, comprising:
a substrate including a first substrate portion including a display area, a second substrate portion including a pad terminal, and a bending area connecting the first substrate portion to the second substrate portion;
an encapsulation portion over the first substrate portion;
a seal portion between the first substrate portion and the encapsulation portion to bond the first substrate portion to the encapsulation portion;
an intermediate wiring including a first intermediate wiring portion electrically connected to a device inside the display area, and a second intermediate wiring portion electrically connected to the pad terminal and covered by at least one inorganic layer; and a connection wiring over the substrate, the connection wiring connecting the first intermediate wiring portion to the second intermediate wiring portion, wherein the bending area is in an interval between the first substrate portion and the second substrate portion and is filled with a bending material including an organic material.

16. The display device as claimed in claim 15, wherein a height of the bending material corresponds to a sum of a first thickness of the at least one inorganic layer and a second thickness of the intermediate wiring in a vertical direction of the substrate.

17. The display device as claimed in claim 16, wherein a support material that supports the substrate is in a portion of the interval between the first substrate portion and the second substrate portion below the bending material.

18. The display device as claimed in claim 16, wherein the connection wiring extends across the first substrate portion, the bending area, and the second substrate portion and is bendable in the bending area.

19. The display device as claimed in claim 18, wherein the connection wiring is connected to the first intermediate wiring portion and to the second intermediate wiring portion respectively by contact portions inside contact holes arranged in the at least one inorganic layer.

20. The display device as claimed in claim 19, wherein:

the connection wiring is exposed over the substrate, an upper organic layer covering the connection wiring is on the connection wiring, and the connection wiring is surrounded by the bending material and the upper organic layer in the bending area.

* * * * *